(12) United States Patent
Hayakawa

(10) Patent No.: US 7,323,744 B2
(45) Date of Patent: Jan. 29, 2008

(54) SEMICONDUCTOR DEVICE AND FABRICATION METHOD THEREFOR

(75) Inventor: Yukio Hayakawa, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/361,724

(22) Filed: Feb. 24, 2006

(65) Prior Publication Data

US 2006/0237779 A1    Oct. 26, 2006

Related U.S. Application Data

(63) Continuation of application No. PCT/JP2005/003024, filed on Feb. 24, 2005.

(51) Int. Cl.
  *H01L 29/423* (2006.01)
(52) U.S. Cl. .................. 257/326; 257/324; 257/315; 257/E29.129
(58) Field of Classification Search .............. 438/954; 257/326, 324, 315, E29.129
  See application file for complete search history.

(56) References Cited

U.S. PATENT DOCUMENTS

| | | | |
|---|---|---|---|
| 5,559,735 A * | 9/1996 | Ono et al. ............... | 365/185.3 |
| 6,011,725 A | 1/2000 | Eitan | |
| 6,555,869 B2 * | 4/2003 | Park .......................... | 257/315 |
| 6,794,711 B2 * | 9/2004 | Kang et al. ................ | 257/315 |
| 2003/0235080 A1 | 12/2003 | Yaegashi et al. | |
| 2005/0162928 A1 * | 7/2005 | Rosmeulen ............ | 365/185.29 |

FOREIGN PATENT DOCUMENTS

| | | |
|---|---|---|
| JP | 2000-031304 | 1/2000 |
| JP | 2004-023044 | 1/2004 |

* cited by examiner

*Primary Examiner*—Sue A. Purvis
*Assistant Examiner*—Victor A. Mandala, Jr.
(74) *Attorney, Agent, or Firm*—Ingrassia Fisher & Lorenz, P.C.

(57) ABSTRACT

A semiconductor device includes an ONO film (17) formed on a semiconductor substrate (15), a first gate (14), the first gate (14) formed on the ONO film (17), a source (10) and a drain (12) provided at both sides of the first gate (14) to face each other, and a second gate (16), the second gate (16) being a side gate provided at a side of the first gate (14) other than the side where the source (10) and the drain (12) are provided. This makes it possible to provide the semiconductor device in which a desired circuit characteristic is obtainable in a non-destructive manner and in a non-volatile fashion while reducing the trial production times thereof for IC development.

17 Claims, 15 Drawing Sheets

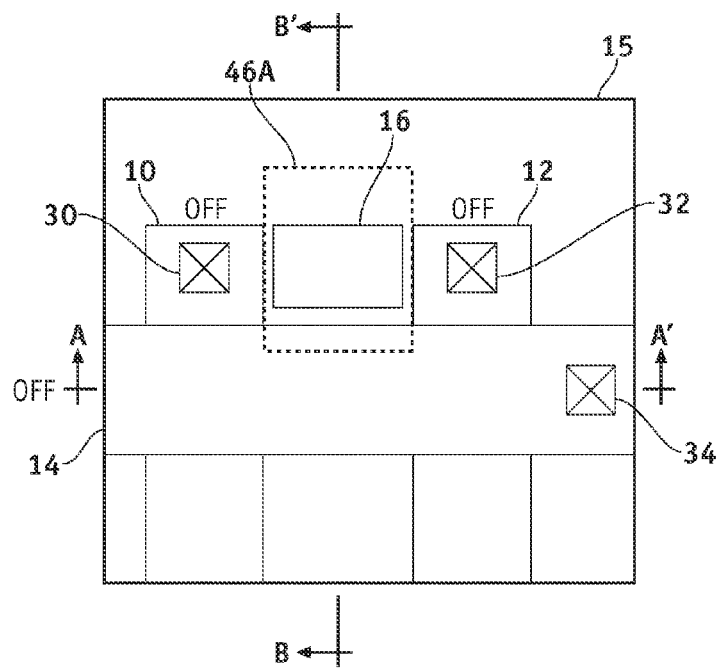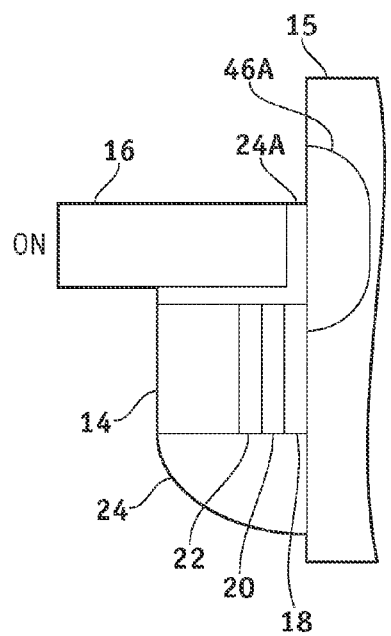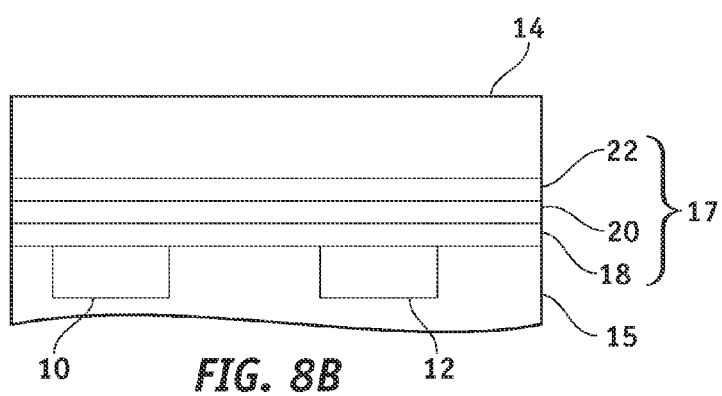
FIG. 8A
FIG. 8C
FIG. 8B

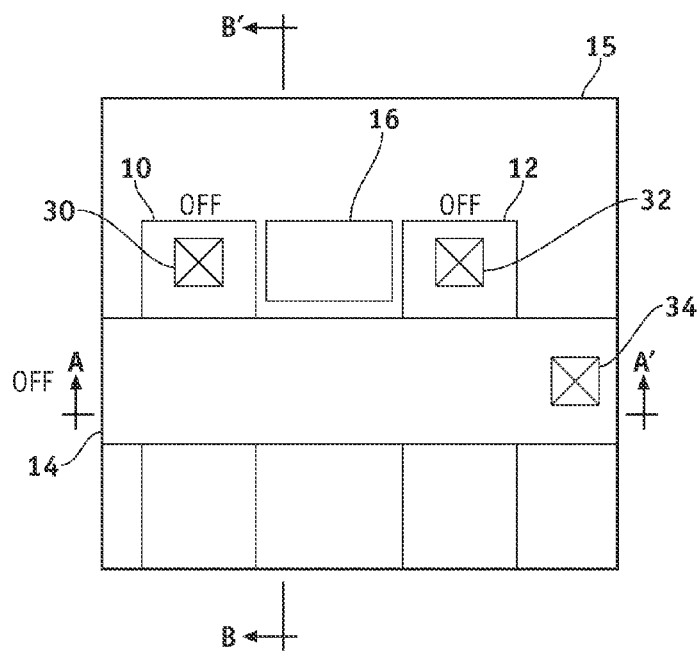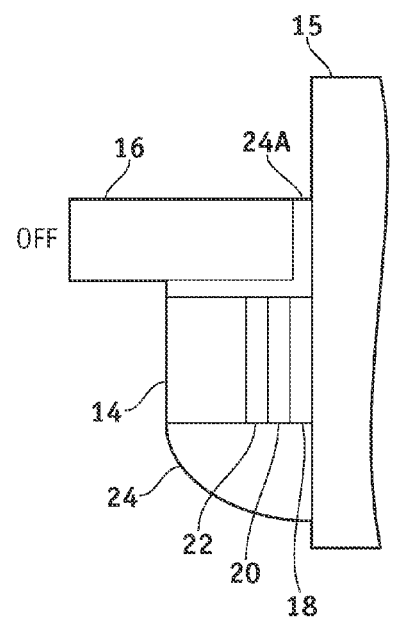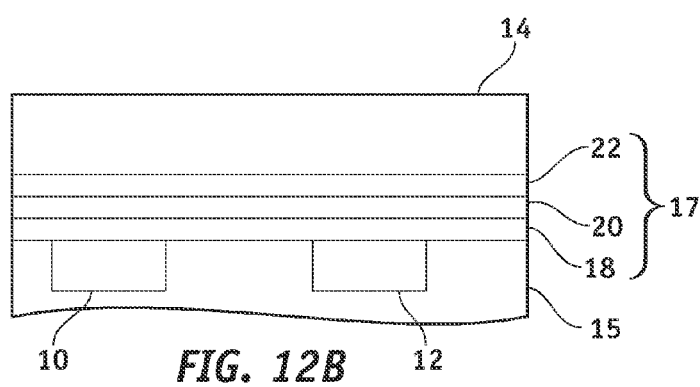
*FIG. 12A*
*FIG. 12C*
*FIG. 12B*

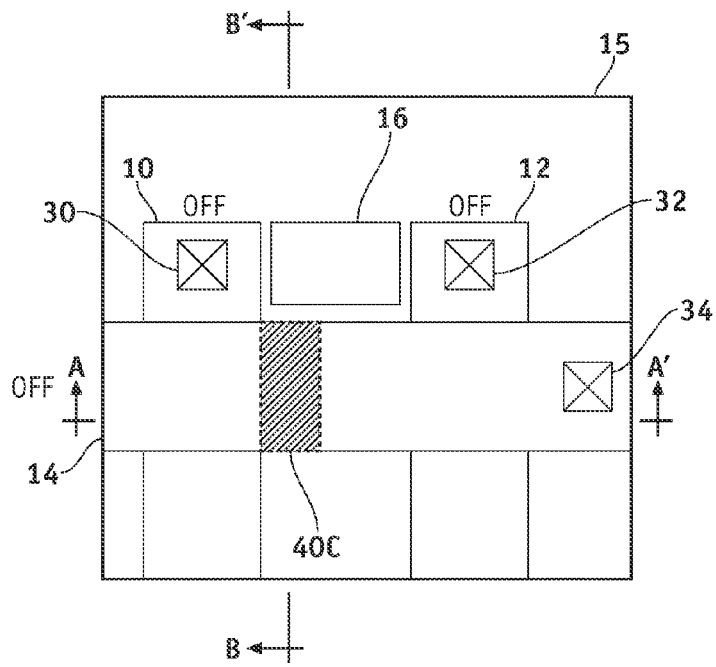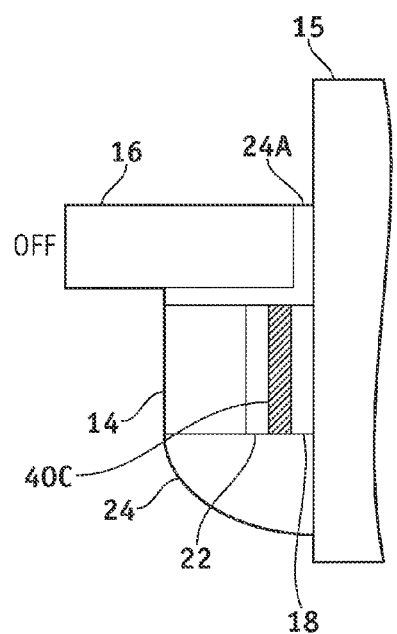
FIG. 14A
FIG. 14C
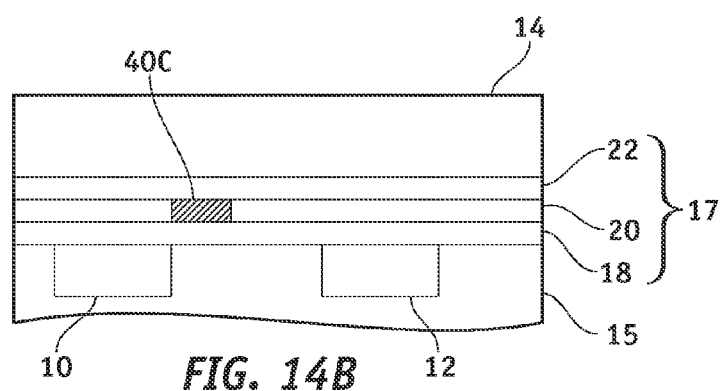
FIG. 14B

SEMICONDUCTOR DEVICE AND FABRICATION METHOD THEREFOR

CROSS-REFERENCES TO RELATED APPLICATIONS

This is a continuation of International Application No. PCT/JP2005/003024, filed Feb. 24, 2005 which was not published in English under PCT Article 21(2).

BACKGROUND OF THE INVENTION

1. Field of the Invention

This invention relates generally to semiconductors and fabrication methods thereof and, more particularly, to a semiconductor device and fabrication method thereof in which an electrical characteristic of a transistor can be changed to a desired characteristic in a non-volatile memory device.

2. Description of the Related Art

In recent years, semiconductor devices (integrated circuits (IC)) having an analog or a digital circuit have been used in various types of electronic devices such as home electric appliances, communication devices, and the like, and have become a key part of progress in the electronics industry. In the constantly advancing field of electronics, an IC having a new circuit is being developed and manufactured everyday. For the development of a new IC, circuit simulation or the like is first carried out and then the circuit is designed so as to obtain the desired characteristics identified during the circuit simulation. Next, a mask, such as a reticle or the like, is produced and a prototype of the IC is manufactured in a process factory. When the prototype of the IC satisfies desired electrical characteristic values, manufacture starts as the next step in the development sequence.

More particularly, flash memories are widely used as non-volatile memories. There are flash memories having an ONO (Oxide/Nitride/Oxide) film such as MONOS (Metal Oxide Nitride Oxide Silicon) films or SONOS (silicon Oxide Nitride Oxide Silicon) films. This type of flash memory has a silicon nitride film, also known as a trap layer, which is provided for storing the charge, the silicon nitride film being sandwiched between silicon oxide films. An example of a flash memory having an ONO film is disclosed in U.S. Pat. No. 6,011,725. In such ONO film flash memories, data is programmed by storing the charge in the silicon nitride film. Such stored charge changes the threshold voltage of the transistor in a non-volatile manner. Reading the data is accomplished by reading the threshold voltage. Erasing the data is accomplished by extracting the stored charge.

In conventional IC development, if the prototype of the IC does not satisfy the desired electrical characteristic value, the reticle pattern has to be redesigned, a new reticle or the like has to be produced, and the prototype IC manufactured again. In cases where the aforementioned feedback is necessary, the burden of managing resources of time and cost for IC development and fabrication is increased. In particular, managing resources for the IC development can be problematic when the custom IC is produced for a small business customer that demands only a small number of final ICs in total. In addition, circuit simulators for the simulation of analog circuits are not as accurate as that for digital circuits. For this reason, a prototype is sometimes fabricated several times to consider fluctuations in the manufacturing process such as the dimension of a gate length, ion implantation, and other manufacturing parameters.

For example, after the product is fabricated on a wafer or chip, the interconnection can be cut to obtain the desired electrical characteristic value for the circuit. However, it takes time to cut the interconnection and a laser or the like is necessary for cutting the interconnection. Also, cutting the interconnection is destructive and irreversible. If the circuit characteristic is changed too much, the electrical characteristics cannot be recovered.

SUMMARY OF THE INVENTION

The present invention has an object of providing a semiconductor device in which a desired characteristic is obtainable in a non-destructive manner and in a non-volatile fashion, reducing the number of trial fabrications for IC development.

In accordance with one aspect of the present invention, preferably, there is provided a semiconductor device including an ONO film formed on a semiconductor substrate, a first gate formed on the ONO film, a source and a drain provided at both sides of the first gate to face each other, and a second gate, the second gate being a side gate provided at a side of the first gate other than the side where the source and the drain are provided. In accordance with the present invention, it is possible to change the electrical characteristics of a transistor such as the threshold voltage or the drain current in a non-volatile fashion. This allows a circuit having the aforementioned transistor to be tuned to the desired circuit characteristics, making it possible to provide a semiconductor device in which the number of trial fabrication times for IC development can be reduced.

In accordance with another aspect of the present invention, preferably, there is provided a method of fabricating a semiconductor device including forming a transistor on a semiconductor substrate and, thereafter, electrically changing and adjusting an electrical characteristic of the transistor in a non-volatile fashion. In accordance with the present invention, even if the circuit does not have the desired characteristic after the transistor is fabricated, the desired circuit characteristic is obtainable after fabrication by changing the electrical characteristic of a given transistor in a non-volatile fashion.

In accordance with another aspect of the present invention, preferably, there is provided a method of controlling a semiconductor device including checking an electrical characteristic of a transistor and electrically changing the electrical characteristic of the transistor in a non-volatile fashion if the electrical characteristic of the transistor is not a desired characteristic. In accordance with the present invention, even if the circuit does not have the desired characteristic after the transistor is fabricated, the desired circuit characteristic is obtainable by changing the electrical characteristic of a given transistor after fabrication in a non-volatile fashion.

In accordance with the present invention, it is also possible to change an electrical characteristic of a transistor such as the threshold voltage, the drain current, or the like in a non-destructive manner and in a non-volatile fashion. This enables the circuit including such transistors to have desired circuit characteristics. In addition, it makes it possible to provide a semiconductor device in which the number of trial fabrication times for IC development can be reduced.

BRIEF DESCRIPTION OF THE DRAWINGS

FIGS. 8(a) through 8(c) are cross-sectional views illustrating a first program operation of Case 1 in accordance with the first embodiment of the present invention;

FIGS. 12(a) through 12(c) are cross-sectional views illustrating a first program operation of Case 2 in accordance with the first embodiment of the present invention;

FIGS. 14(a) through 14(c) are cross-sectional views illustrating a third program operation of Case 2 in accordance with the first embodiment of the present invention;

DETAILED DESCRIPTION OF THE INVENTION

In a transistor in accordance with the present invention, electrical characteristics such as the threshold voltage of the transistor or the drain current thereof can be changed in a non-volatile fashion. In this specification, "program" denotes that the electrical characteristic of the transistor is changed in a non-volatile fashion and "erase" denotes that the electrical characteristic of the transistor is returned back to its original state.

Figure 1:
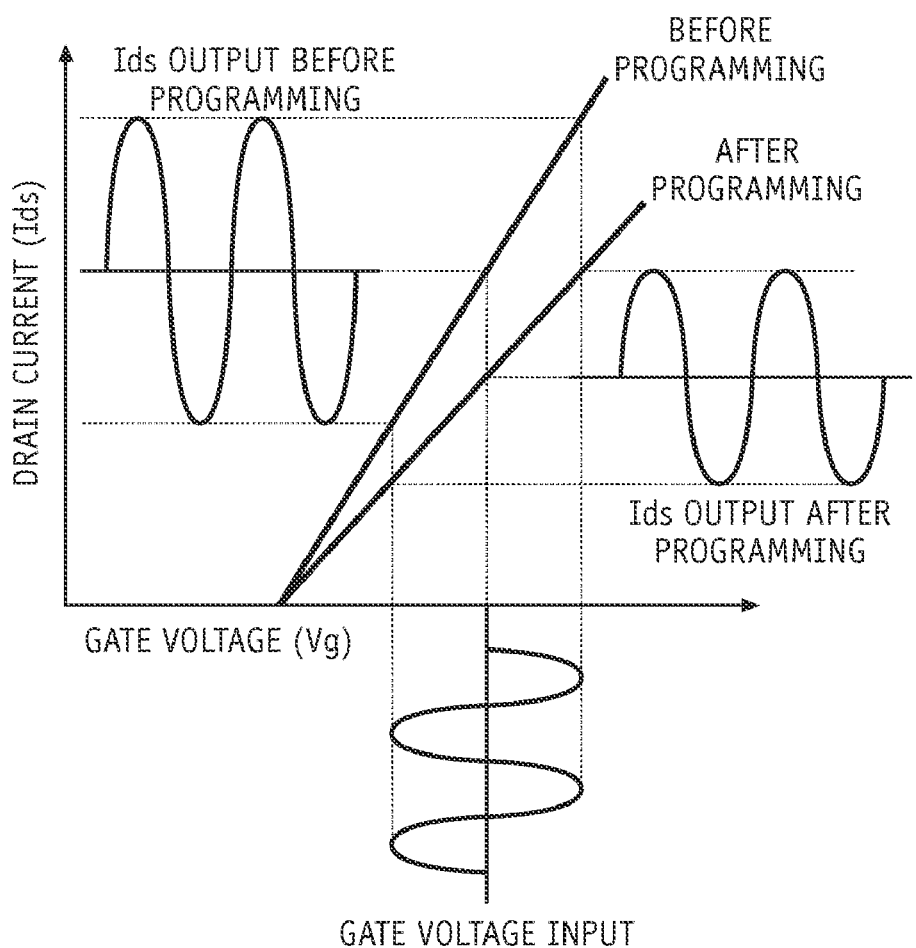
FIG. 1 shows transistor characteristics before and after programming of a first case (Case 1) in accordance with a first embodiment of the present invention.

FIG. 1 shows an example in which the drain current of a transistor in accordance with the present invention has been changed (programmed) in a non-volatile fashion. The horizontal axis represents a gate voltage Vg, and the vertical axis represents a drain current Ids. After programming, the drain current becomes smaller even though the threshold voltage does not change. If a gate voltage of a same amplitude is input into the gate, the amplitude in the drain current output is smaller after programming than before.

Figure 2:
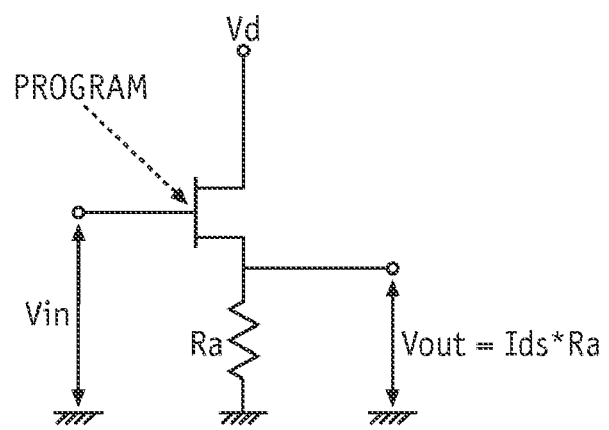
FIG. 2 shows a circuit configuration that includes a transistor in accordance with the first embodiment of the present invention.

For example, in the circuit shown in FIG. 2, a resistor Ra is connected to a source of the above-mentioned transistor and is grounded. In this circuit, Ids×Ra is output as an output voltage Vout, when an input voltage Vin is applied to the gate and Vd to the drain. In the circuit shown in FIG. 2, the output voltage Vout can be changed by programming to change the drain current, even with the same input voltage Vin. In this manner, with a transistor in accordance with the present invention, it is possible to change the electrical characteristic of the transistor in a non-volatile fashion. Consequently, this enables the circuit characteristic of a circuit including the transistor to be changed in a non-volatile fashion.

Figure 3A:
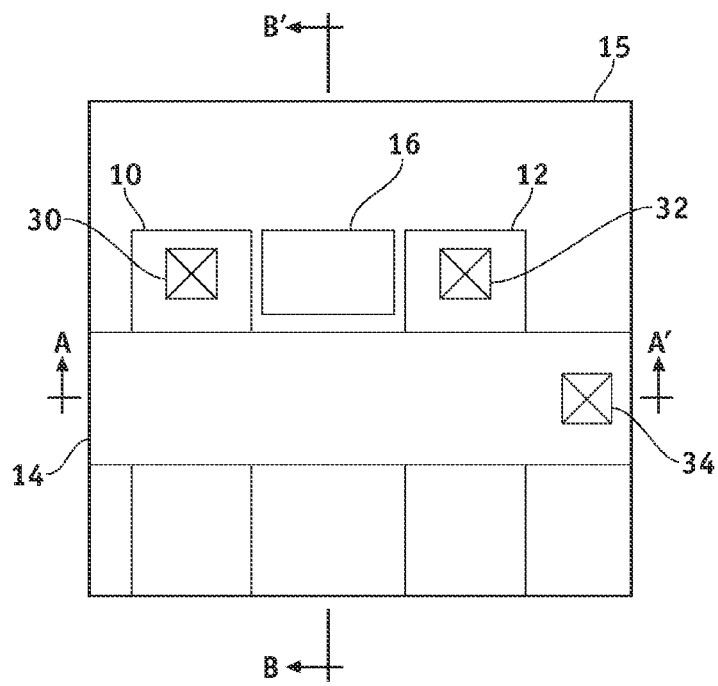
FIGS. 3(a) through 3(c) show cross-sectional views of a configuration in accordance with the first embodiment of the present invention.
Figure 3C:
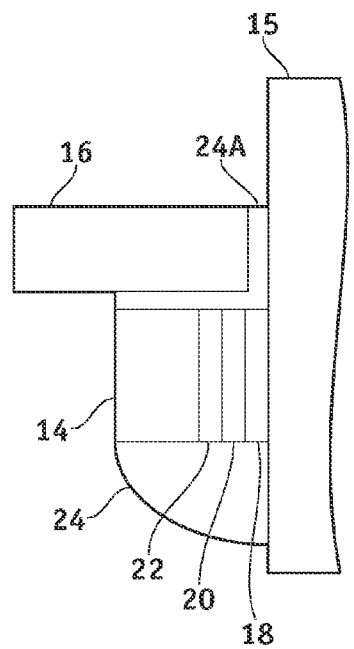
Figure 3B:
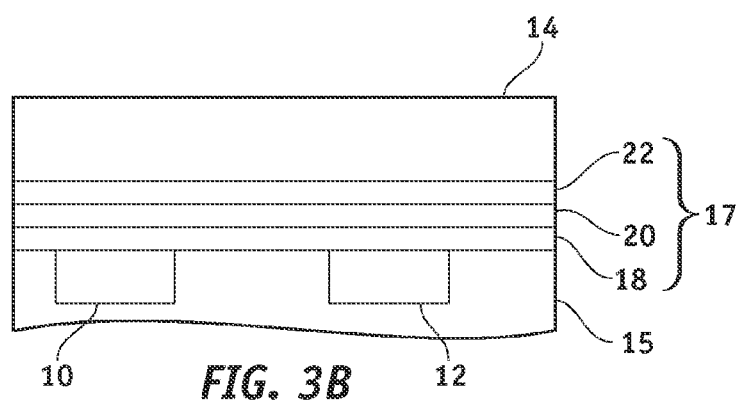

A first embodiment of the present invention exemplifies a transistor in which the characteristic thereof can be changed in a non-volatile fashion. FIGS. 3(a) through 3(c) show a configuration of a transistor in accordance with the first embodiment of the present invention wherein a protection film, an interconnection, an interlayer insulation film, a sidewall and an ONO film are not shown. FIG. 3(a) is a top view, FIG. 3(b) is a cross-sectional view taken along a line A-A' of FIG. 3(a), and FIG. 3(c) is a cross-sectional view take along a line B-B' of FIG. 3(a). Serving as an ONO film 17, a tunnel oxide film 18, a trap layer 20, and a top oxide layer 22 are formed on a P-type silicon semiconductor substrate 15 (or, alternatively, formed on a P-type region formed on a semiconductor substrate). A gate 14 (a first gate) is provided on the ONO film 17. A source 10 and a drain 12 are provided at (both) sides of the gate 14 (the first gate) and facing each other. A channel, not shown, is formed between the source 10 and the drain 12 below the gate 14 (the first gate). A side gate 16 (a second gate) is provided at one side of the gate 14 (the first gate) other than the side where the source and the drain are provided. That is, the side gate 16 is provided along the channel. An insulation film 24a is formed between the side gate 16 and the gate 14 (the first gate) and is also formed between the side gate 16 and the semiconductor substrate 15. In addition, a sidewall 24 is provided to face the side gate 16. The source 10, the drain 12, and the gate 14 are respectively coupled to an upper interconnection, via contact holes 30, 32, and 34.

Figure 4A:
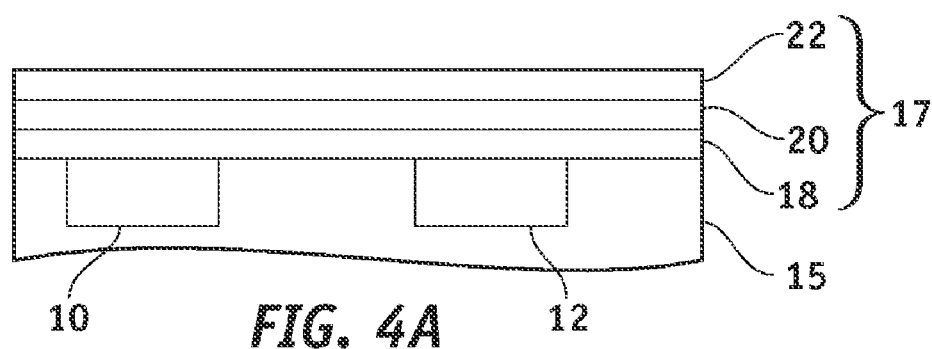
FIGS. 4(a) and 4(b) are cross-sectional views showing first fabrication processes in accordance with the first embodiment of the present invention.

Referring to FIGS. 4(a) through 5(d), a description will be given of a fabrication method in accordance with the first embodiment of the present invention. FIGS. 4(a) and 4(b) are cross-sectional views take along the line A-A' shown in FIG. 3(a). FIGS. 5(a) through 5(d) are cross-sectional views take along the line B-B' shown in FIG. 3(a). On the P-type silicon semiconductor substrate 15, as the ONO film 17, there are provided the tunnel oxide film 18, the trap layer 20, and the top oxide layer 22. The tunnel oxide film 18 is, for example, a seven nanometer (nm) thick silicon oxide film formed by any one of known fabrication processes such as chemical vapor deposition (CVD) or thermal oxidation. The trap layer 20 is, for example, a ten run thick silicon oxide film formed by, for example, CVD. The top oxide layer 22 may also be a ten nm thick silicon oxide film formed by CVD or thermal oxidation. Arsenic ions, for example, are implanted in a given region of the semiconductor substrate 15 and thermal processing is performed to obtain the source 10 and the drain 12.

Figure 4B:
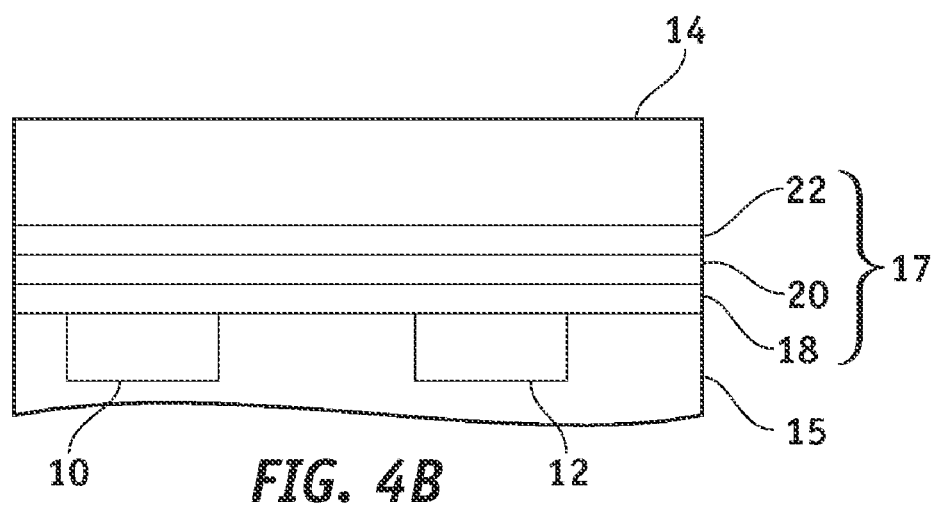

Referring to FIG. 4(b), for example, a 120 nm thick polysilicon layer into which phosphorous is doped is formed and a given region is etched away to create the gate 14.

Figure 5A:
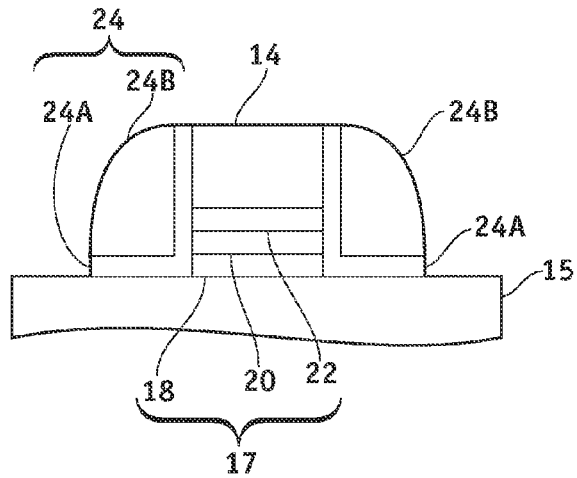
FIGS. 5(a) through 5(d) are cross-sectional views showing additional fabrication processes in accordance with the first embodiment of the present invention.

Referring to FIG. 5(a), the ONO film 17 is next etched with the gate 14 used as a mask. For example, a twenty nm thick silicon nitride film and a ninety nm thick silicon oxide film are deposited by CVD processing over the whole surface and, thereafter, the whole surface is etched. This forms the sidewalls 24, each of which includes the insulation film 24a and a silicon oxide film 24b, provided on the sides of the gate 14 and the ONO film 17.

Figure 5C:
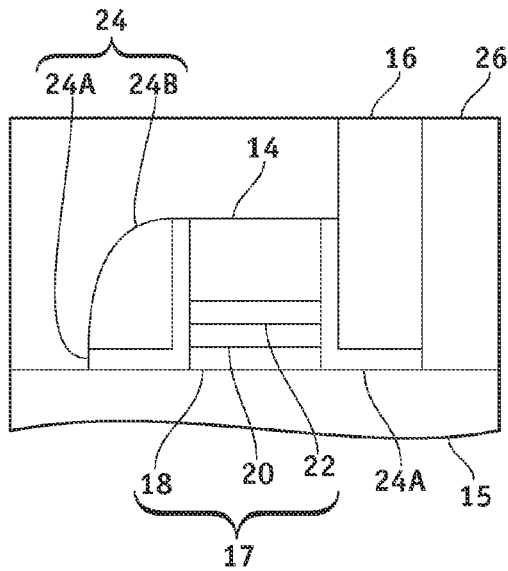
Figure 5B:
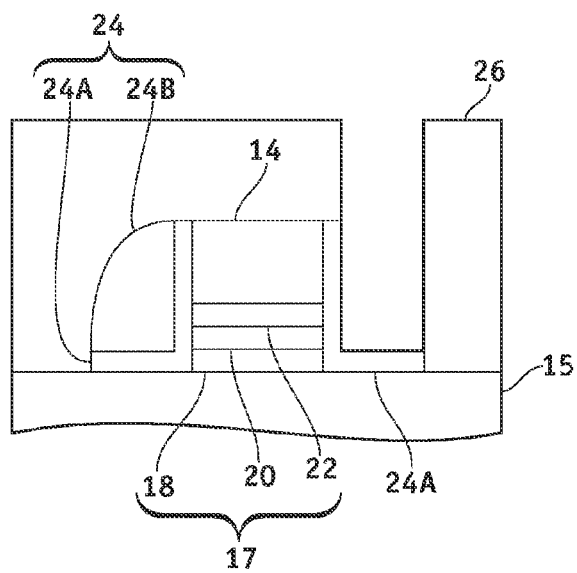

Referring to FIG. 5(b), as the interlayer insulation film 26, a silicon oxide film of, for example, 1500 nm thick Boro Phospho Silicated Glass (BPSG) or the like is formed. A given region of the interlayer insulation film 26 is etched for forming a hole for the side gate. During this etch process, the silicon oxide film and the silicon nitride film are configured to have etch selectivities such that etching will be stopped at the insulation film 24a of the silicon nitride film. In addition, it is possible to simultaneously form the source 10, the drain 12, the gate 14, and the contact holes 30, 32, and 34 that connect the gate 14 with the interconnection. There is no silicon nitride film arranged below the contact holes 30, 32, and 34. Hence, this enables the contact holes to respectively reach the surfaces of the source 10, the drain 12, and the gate 14.

Referring to FIG. 5(c), for example, a fifteen nm thick TiN film and a forty nm thick Ti film are deposited by sputtering as barrier metals. For example, tungsten is deposited by CVD processing to have a thickness of 400 nm on the barrier metals, and is planarized by CMP to form the side gate 16. At this time, the contact holes 30, 32, and 34 are simultaneously created. The side gate 16 is formed on the insulation film 24a of the silicon nitride film, which is sandwiched between the side gate 16 and the semiconductor substrate 15.

Figure 5D:
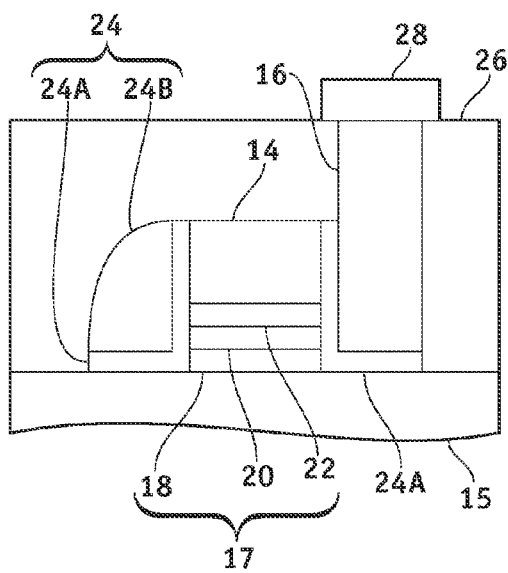

Referring to FIG. 5(d), for example, aluminum is employed as an interconnection 28. The protection film (not shown) is then formed, completing processing of the transistor in accordance with the first embodiment of the present invention.

Figure 6:
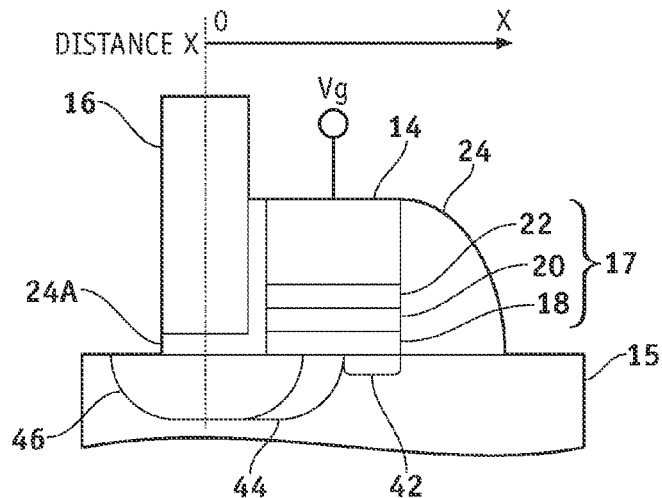
FIG. 6 shows a coordinate X from a side gate to a gate in accordance with the first embodiment of the present invention.

Next, a description will be given of an accumulation layer 46, a depletion layer 44, and a channel (inversion layer) 42. FIG. 6 is a cross-sectional view having a configuration similar to that shown in FIG. 3(c) (where right and left are reversed), and schematically shows the accumulation layer 46, the depletion layer 44, and the channel (inversion layer) 42. When a voltage Vg, greater than the threshold voltage, is applied to the gate 14 and a given voltage is applied to the side gate 16, the accumulation layer 46 is formed below the side gate 16 in the semiconductor substrate 15 and the channel (inversion layer) 42 is formed below the gate 14 in the semiconductor substrate 15. The depletion layer 44 is formed between the accumulation layer 46 and the channel (inversion layer) 42.

Figure 7:
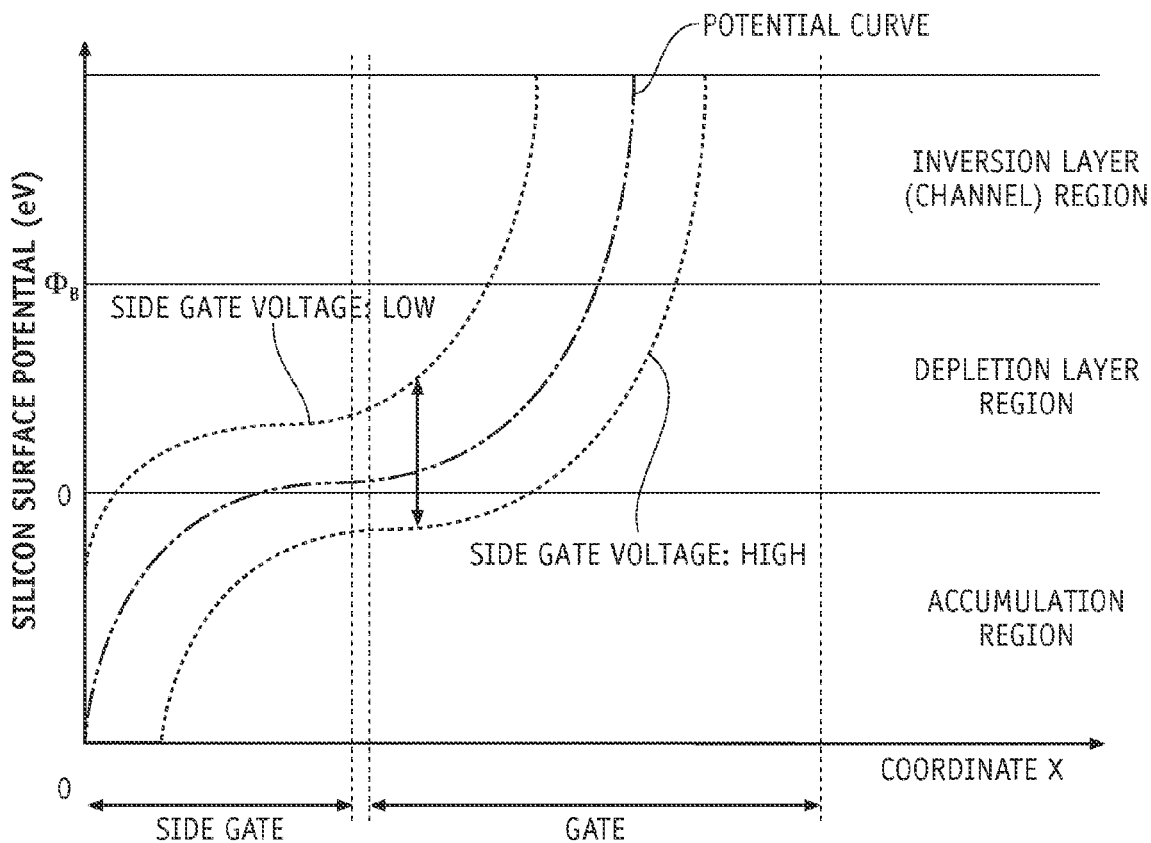
FIG. 7 shows surface potentials of the coordinate X from the side gate to the gate in accordance with the first embodiment of the present invention.

Referring to FIG. 7, the horizontal axis denotes a coordinate X in a gate direction, setting 0 at a center of the side gate 16 shown in FIG. 6. On the horizontal axis, a range depicting the side gate corresponds to a coordinate arranged below the side gate 16 and another range depicting the gate corresponds to another coordinate arranged below the gate 14. The vertical axis denotes silicon surface potentials at the coordinate X. If a silicon surface potential is smaller than 0, the accumulation layer 46 is formed at the coordinate X. If the silicon surface potential is a center value øb of the band gap of silicon, the inversion layer is formed at the coordinate X. If electrons are induced into the inversion layer, the channel 42 is formed. If the silicon surface potential falls into a range from 0 to øb, the depletion layer 44 is formed at the coordinate X.

Potential curves shown in FIG. 7 show potentials on the silicon surface in a case where, for example, 3.3V is applied to the gate 14 and a given voltage is applied to the side gate 16. In this case, the accumulation layer 46 occupies a region arranged below the side gate 16 corresponding to practically the whole area of the side gate 16. The depletion layer 44 occupies a region arranged below the gate 14 corresponding to approximately half the area of the gate 14, and the channel (inversion layer) 42 occupies the remaining half thereof. A dotted line depicting the 'SIDE GATE VOLTAGE: HIGH' represents another potential curve for a case where the further side gate voltage is applied. The depletion layer 44 extends further through the region arranged below the gate 14, and the channel (inversion layer) 42 is reduced in that region. On the contrary, in the case where the side gate voltage is lowered ('SIDE GATE VOLTAGE: LOW'), the depletion layer 44 is reduced in the region below the gate 14 and the channel (inversion layer) 42 extends further into the region thereof. In this manner, changing the side gate voltage makes it possible to control how far the depletion layer 44 extends into the region arranged below the gate 14 and, further, to control the width of the channel 42.

Next, a description will be given of the operation of a transistor in accordance with the first embodiment of the present invention. Table 1 shows examples of respective terminals during programming, a regular operation and erasing. During programming, a given voltage is applied to the side gate as Vsg, and 3.3 V and 1.5 V are respectively applied to the gate and the source. During the regular operation, 1.5 V and 0.7 V are respectively applied to the gate and the drain. During erasing, −5 V is applied to the gate. The operations will be further explained below. In the following description, OFF denotes a connection to ground. First, a description will be given of programming in a case (Case 1) where the drain current of the transistor is changed in a non-volatile fashion.

TABLE 1

|  | Side gate | Gate | Drain | Source |
|---|---|---|---|---|
| Programming | Vsg | 3.3 V | 0 V | 1.5 V |
| Regular operation | 0 V | 1.5 V | 0.7 V | 0 V |
| Erasing | 0 V | −5.0 V | 0 V | 0 V |

FIGS. 8(a) through 10(c) schematically show the same configuration as that shown in FIGS. 3(a) through 3(c), and includes an accumulation layer 46a, a depletion layer 44a, channel 42a, and a charge storage region 40a. The source 10, the drain 12, and the gate 14 are set to OFF, and the side gate 16 is set to on to apply a given voltage. This creates the accumulation layer 46a in a peripheral region adjoining the side gate 16 in the semiconductor substrate 15, as described above.

Figure 9A:
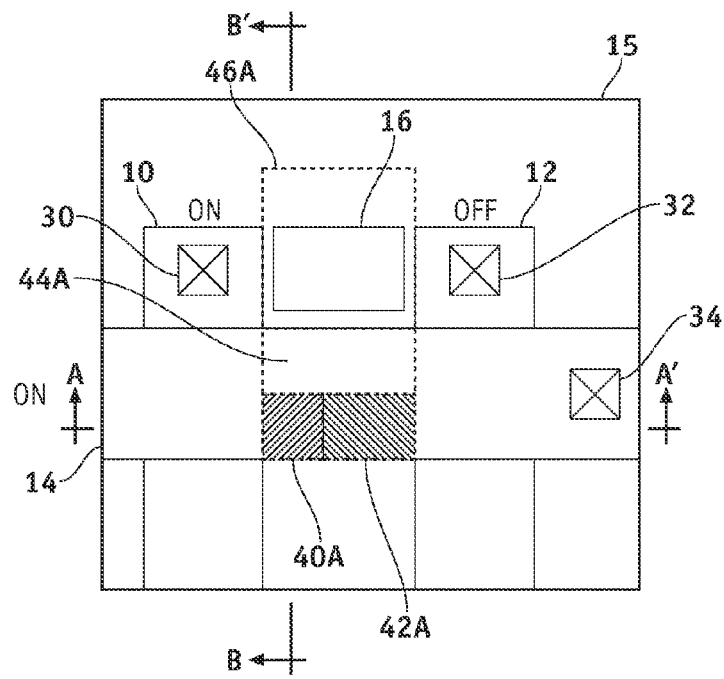
FIGS. 9(a) through 9(c) are cross-sectional views illustrating a second program operation of Case 1 in accordance with the first embodiment of the present invention.
Figure 9C:
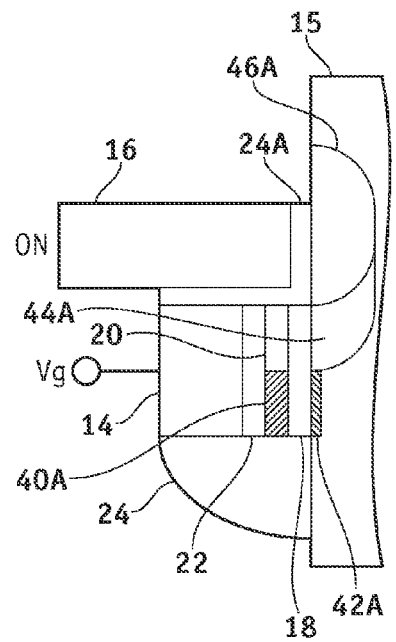
Figure 9B:
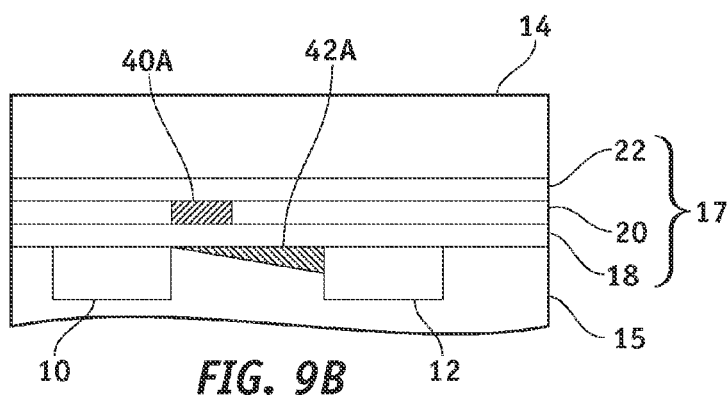

Next, referring to FIGS. 9(a) through 9(c), the source 10 and the gate 14 are set to on, while a given voltage is being applied to the side gate 16. For example, 1.5 V and 3.3 V are respectively applied. This creates the depletion layer 44a on a side of the side gate 16 and creates the channel 42a on an opposite side of the side gate 16, in a region arranged below the gate 14 and included in the semiconductor substrate 15. Hot electrons generated in the channel 42a are stored in the trap layer 20 on the side of the source 10 below the gate 14, thereby forming the charge storage region 40a.

Figure 10A:
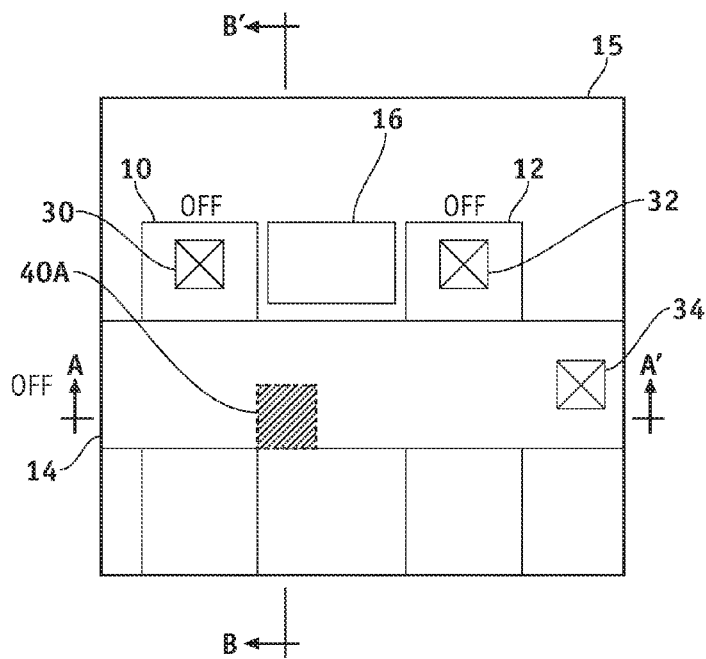
FIGS. 10(a) through 10(c) are cross-sectional views illustrating a third program operation of Case 1 in accordance with the first embodiment of the present invention.
Figure 10C:
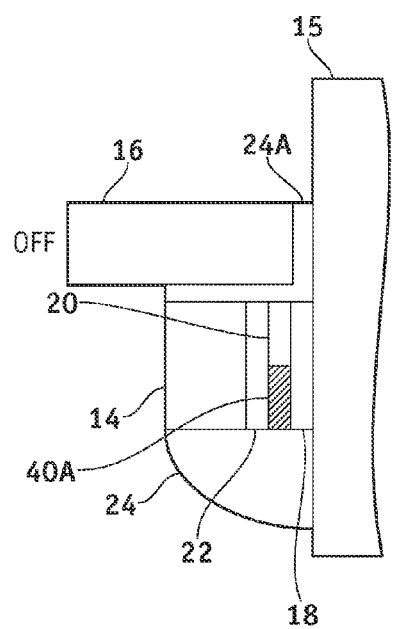
Figure 10B:
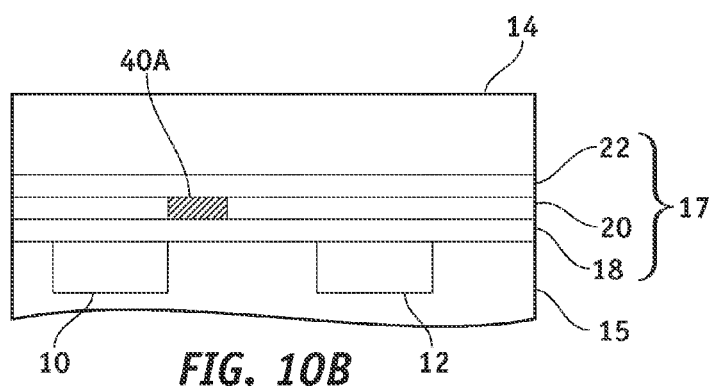

Next, referring to FIGS. 10(a) through 10(c), the source 10, the drain 12, the gate 14, and the side gate 16 are set to OFF, and the accumulation layer 46a, the depletion layer 44a, and the channel 42a, which were formed in the semiconductor substrate 15, no longer exist. The charge storage region 40a formed in the trap layer 20 is surrounded by the tunnel oxide film 18 and the top oxide layer 22 that are made of silicon oxide films, and retains the charge in a non-volatile fashion. The programming of Case 1 is thus completed.

Figure 11A:
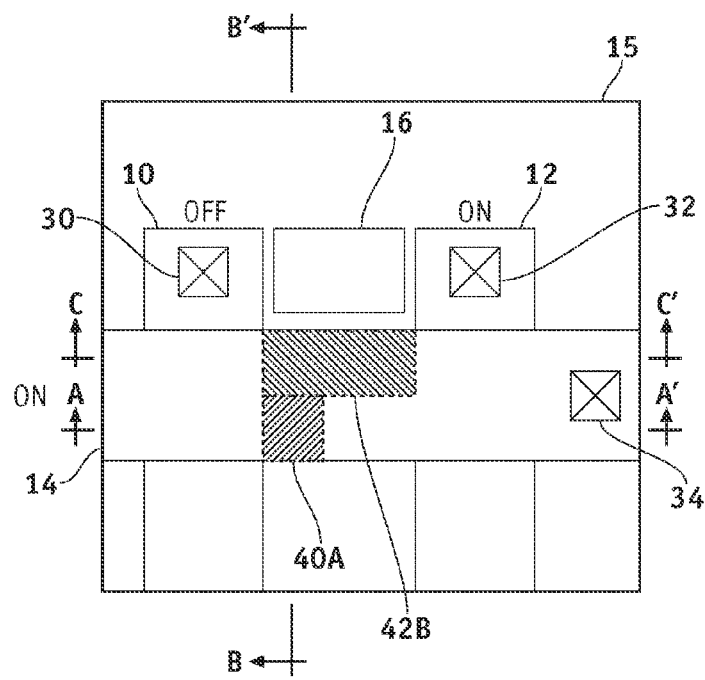
FIGS. 11 (a) through 11(d) are cross-sectional views illustrating regular operation of Case 1 in accordance with the first embodiment of the present invention.
Figure 11C:
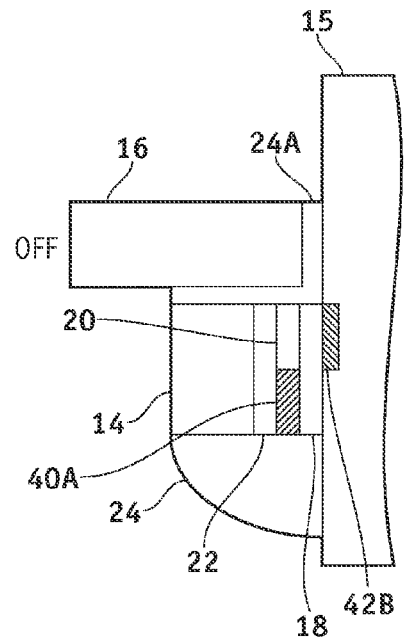
Figure 11B:
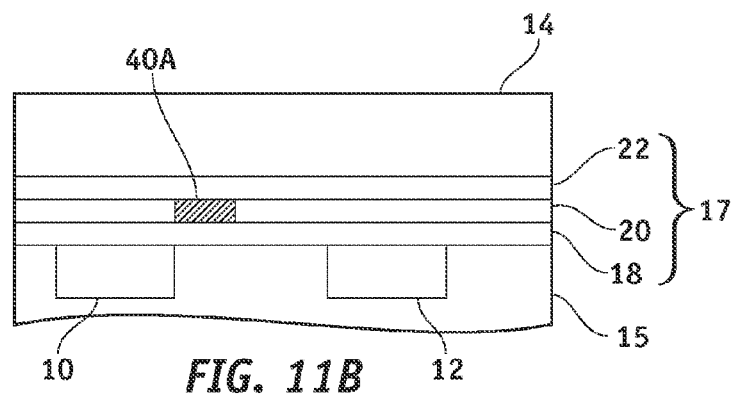
Figure 11D:
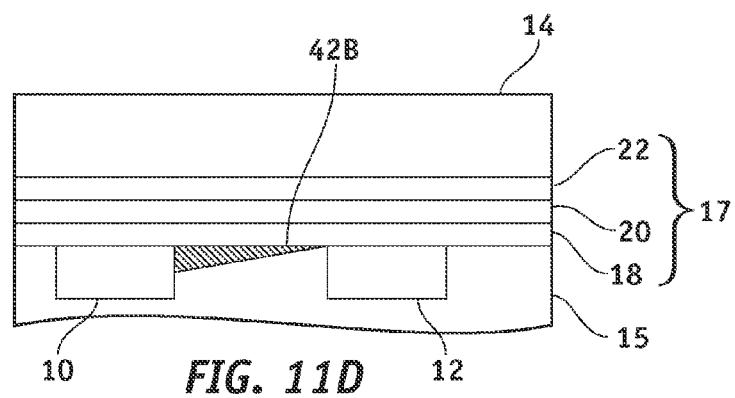

A description will next be given of the regular operation of the transistor after the programming of Case 1. FIGS. 11(a) through 11(d) show the transistor during regular operation. FIG. 11(a) is a top view. FIG. 11(b) is a cross-sectional view taken along a line A-A' of FIG. 11(a). FIG. 11(c) is a cross-sectional view take along a line B-B' of FIG. 11(a). And FIG. 11(d) is a cross-sectional view take along a line C-C' of FIG. 11(a). A channel 42b and the charge storage region 40a are schematically shown. The source 10 and the side gate 16 are set to OFF, the drain 12 and the gate 14 are set to on, and, for example, 0.7 V and 1.5 V are respectively applied. At this time, as shown in FIG. 11(d), the channel 42b is formed between the source 10 and the drain 12 on the side of the side gate 16 below the gate 14. However, the channel is not formed on an opposite side of the side gate 16 below the gate 14, as shown in FIG. 11(b). This is because the charge storage region 40a is formed on the side of the source 10.

Accordingly, a width W of the channel becomes narrower due to the charge storage region 40a. The drain current Ids is proportional to $(W/L) \times (V_g - V_t)/V_d$, where W denotes a channel width, L denotes a channel length, Vg denotes a gate voltage, Vd denotes a drain current, and Vt denote a threshold voltage. W becomes smaller after programming than before programming in Case 1 and, therefore, the threshold voltage is not changed. However, the slope of the drain current Ids toward the gate voltage becomes smaller, as shown in FIG. 1.

As described above, the charge storage region 40 having a desired width is obtainable by controlling the voltage applied to the side gate during the programming of Case 1. The charge storage region 40 is retained in a non-volatile fashion. Then, during operation of the transistor, the channel 42 is not formed below the charge storage region 40. This narrows the channel width W before programming, making the drain current Ids smaller. In this manner, it is possible to change the drain current Ids in a non-volatile fashion.

Next, referring to FIGS. 12(a) through 14(c), a description will be given of programming in another case (Case 2) where the drain current of the transistor is changed in a non-volatile fashion.

FIGS. 12(a) through 12(c) correspond to FIGS. 8(a) through 8(c). The source 10, the drain 12, the gate 14, and the side gate 16 are set to OFF. The side gate 16 is set to OFF and the accumulation layer 46, as described in regards to FIGS. 8(a) through 8(c), is not provided.

Figure 13A:
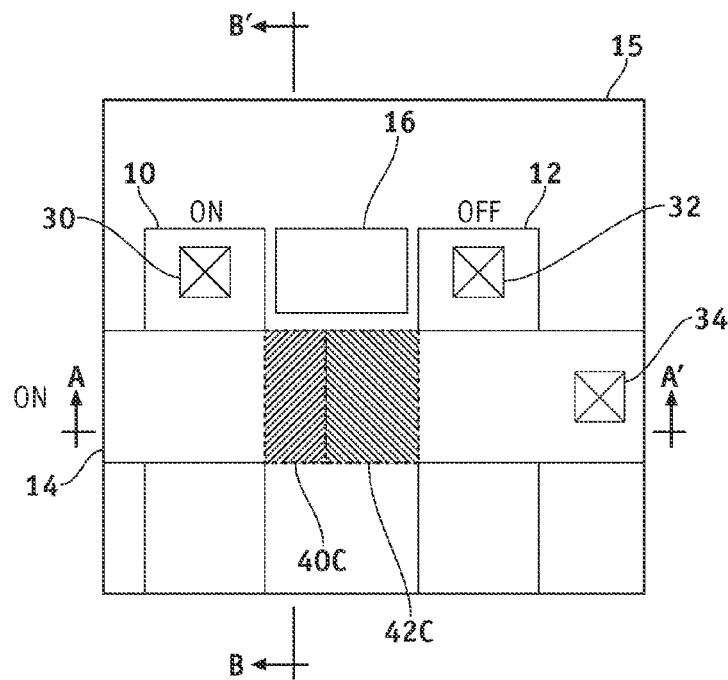
FIGS. 13(a) through 13(c) are cross-sectional views illustrating a second program operation of Case 2 in accordance with the first embodiment of the present invention.
Figure 13C:
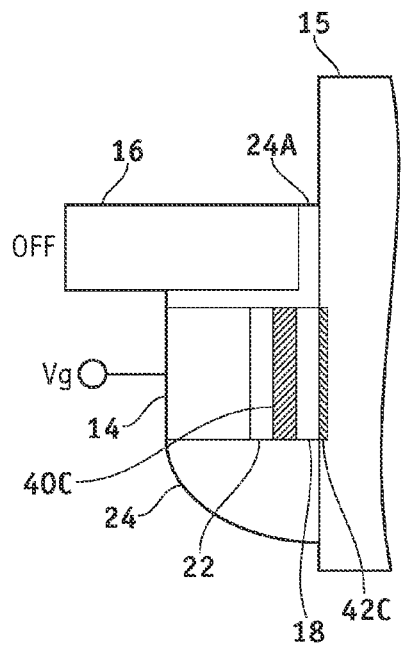
Figure 13B:
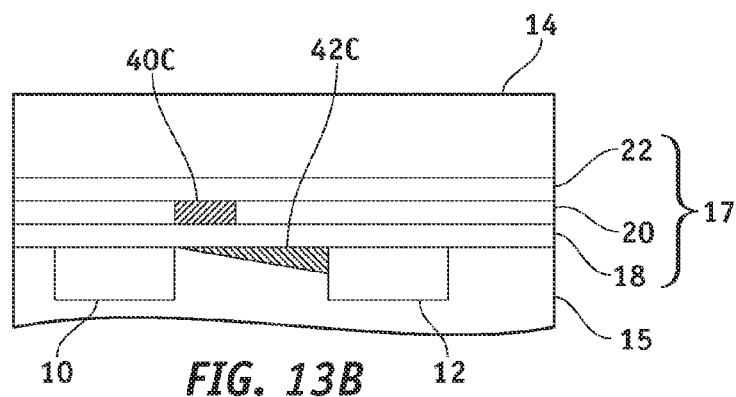

Next, referring to FIGS. 13(a) through 13(c), the source 10 and the gate 14 are set to ON, and, for example, 1.5 V and 3.3 V are respectively applied thereto. This creates a channel 42c in a region below the gate 14 corresponding to the whole area of the gate 14. Hot electrons generated in the channel 42c are stored in a region provided in the trap layer 20, the region being arranged on the side of the source 10 below the gate 14. The amount of the stored charge is controllable by time.

Next, referring to FIGS. 14(a) through 14(c), the source 10, the drain 12, the gate 14, and the side gate 16 are set to OFF, and the channel 42c that has been created in the semiconductor substrate 15 no longer exists. A charge storage region 40c created in the trap layer 20 retains the charge in a non-volatile fashion. Programming in accordance with Case 2 is thus completed.

Figure 15A:
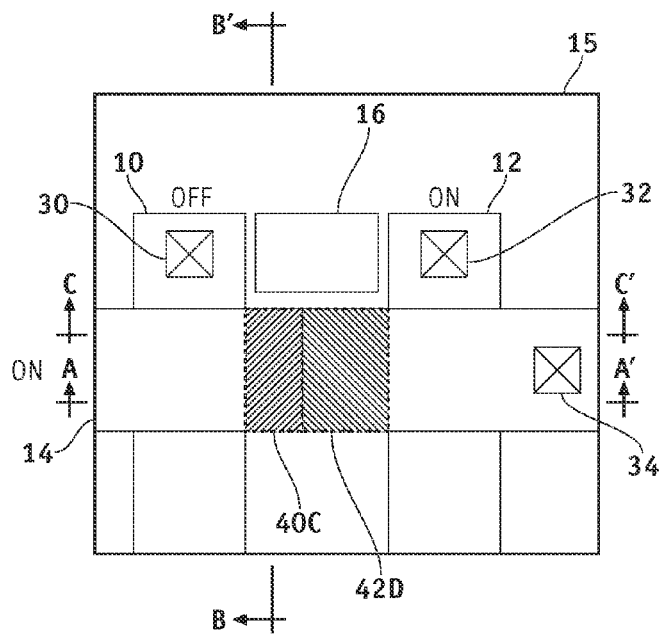
FIGS. 15(a) through 15(d) are cross-sectional views illustrating the regular operation of Case 2 in accordance with the first embodiment of the present invention.
Figure 15C:
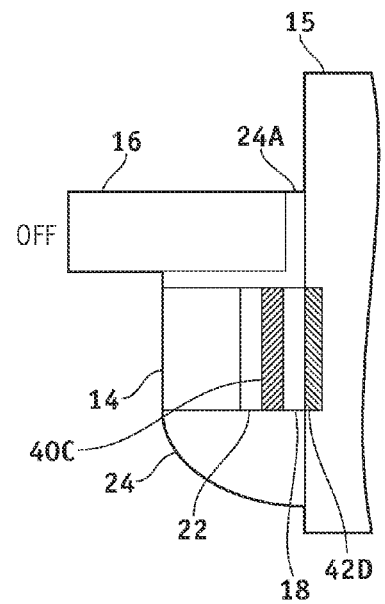
Figure 15B:
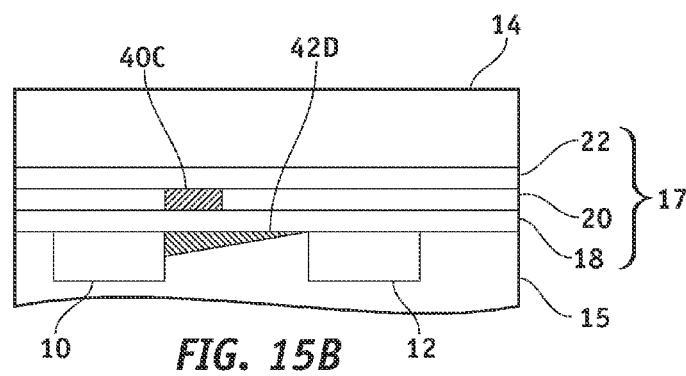
Figure 15D:
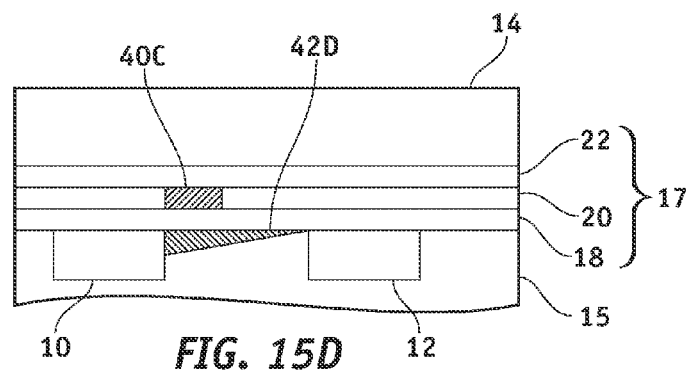
Figure 16:
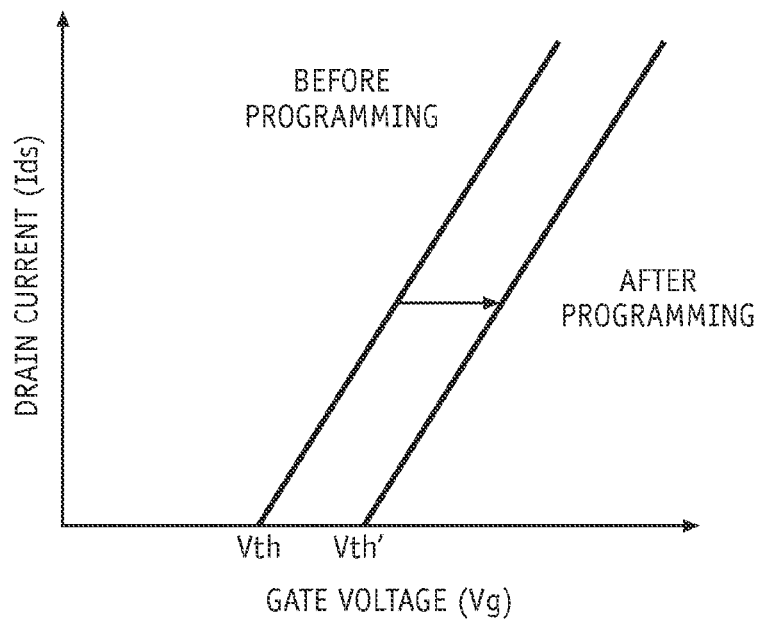
FIG. 16 shows transistor characteristics before and after programming of Case 2 in accordance with the first embodiment of the present invention.

A description will next be given of regular operation after programming in accordance with Case 2. FIGS. 15(a) through 15(d) show the transistor during regular operation. FIG. 15(a) is a top view. FIG. 15(b) is a cross-sectional view taken along a line A-A' of FIG. 15(a). FIG. 15(c) is a cross-sectional view taken along a line B-B' of FIG. 15(a). FIG. 15(d) is a cross-sectional view taken along a line C-C' of FIG. 15(a). The source 10 and the side gate 16 are set to OFF, and the drain 12 and the gate 14 are set to ON. Then, 0.7 V and 1.5 V, for example, are respectively applied. A channel 42d is created between the source 10 and the drain 12 in a region below gate 14. However, owing to the charge storage region 40c formed on the side of the source 10, the channel 42d cannot be created in the transistor unless a voltage greater than that applied before programming is applied. In other words, the threshold voltage Vth is increased. On the other hand, the channel width of the channel 42d is not changed, even in the programming of Case 2. Therefore, the slope of the drain current toward the gate voltage is not changed. FIG. 16 shows characteristics of the drain current Ids and the gate voltage Vg, before and after the programming of Case 2. The threshold voltage is increased from Vth to Vth'. In contrast, while the threshold voltage is increased, the slope of the drain current toward the gate voltage is not changed.

As described, during the programming of Case 2, the charge storage region 40c is created as much as the whole channel width, making it possible to change the threshold voltage of the transistor in a non-volatile fashion. In addition, a desired threshold voltage is obtainable by adjusting the charge amount to be charged on the charge storage region 40c.

Next, a description will be given of erasing for Case 1 and Case 2. For example, the source 10, the drain 12, and the side gate 16 are set to OFF, and the gate 14 is set to ON to apply −5 V thereto. This makes Fowler-Nordheim (F-N) tunneling current flow across the tunnel oxide film 18, and the charge storage region 40 no longer exists. This returns the transistor back to the situation before programming. Erasing may be implemented by using hot holes.

During the programming of Case 1 and Case 2, the drain current and the threshold voltage are separately changed in a non-volatile fashion. However, both the drain current and the threshold voltage may be changed in a non-volatile fashion by combining the programming of Case 1 and Case 2.

As described above, in a transistor in accordance with the first embodiment of the present invention, it is possible to change at least one of the threshold voltage and the drain current by programming in a non-destructive and non-volatile manner. In addition, the original electrical characteristic is returnable by erasing. Such programming and erasing can be repeated any number of times. The electrical characteristic of a circuit in an IC can be changed to a desired value in a non-volatile fashion by employing the transistor in accordance with the first embodiment of the present invention as an important transistor that specifies the electrical characteristic of the circuit.

Figure 17:
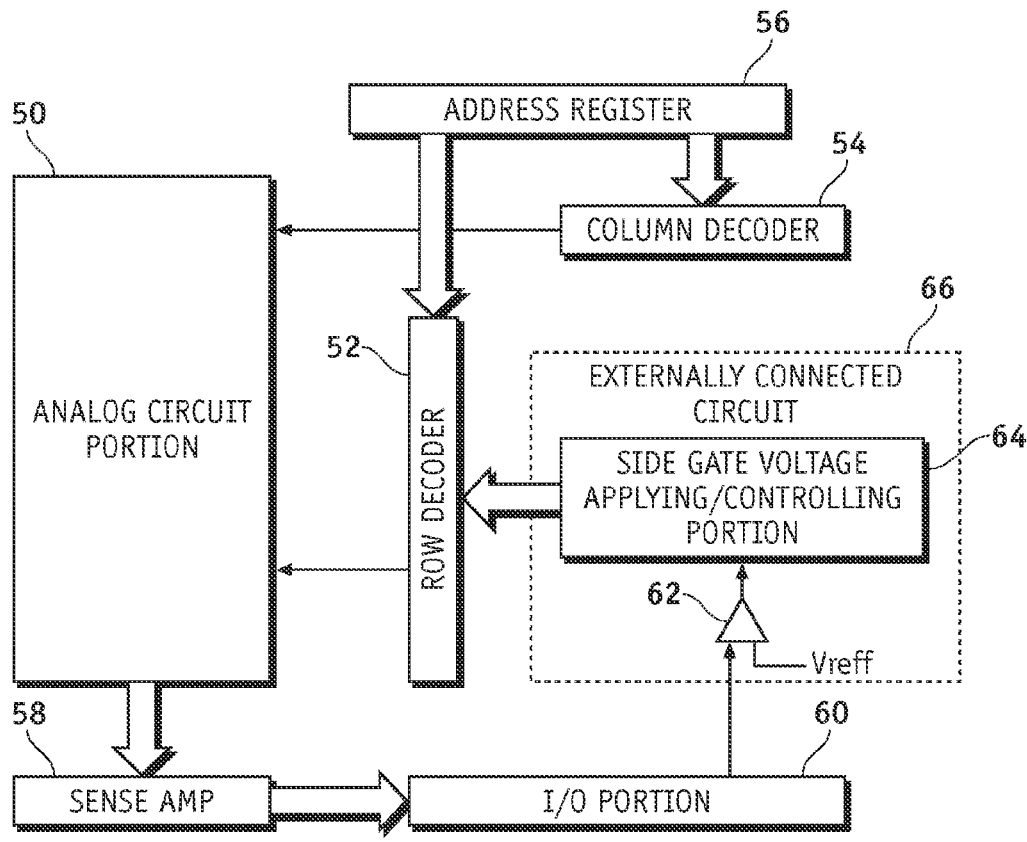
FIG. 17 shows a circuit configuration in accordance with a second embodiment of the present invention.

A second embodiment of the present invention exemplifies a semiconductor device that includes an analog circuit having a transistor in accordance with the first embodiment. FIG. 17 is a view illustrating a configuration in accordance with the second embodiment. In the second embodiment, there is provided an analog circuit portion 50, a row decoder 52, a column decoder 54, and an address register 56. The row decoder 52 and the column decoder 54 specify a given transistor to be erased. The address register 56 supplies an address of the given transistor. In addition, the semiconductor device in accordance with the second embodiment further includes a sense amplifier 58 and an input/output circuit (I/O) portion 60. The sense amplifier 58 reads out the electrical characteristic of the transistor. The I/O portion 60 outputs the electrical characteristic of the transistor to an external circuit. An externally connected circuit 66 is a circuit externally connectable to the semiconductor device in accordance with the second embodiment and including a differential amplifier 62 and a side gate voltage applying/controlling portion 64.

Figure 18:
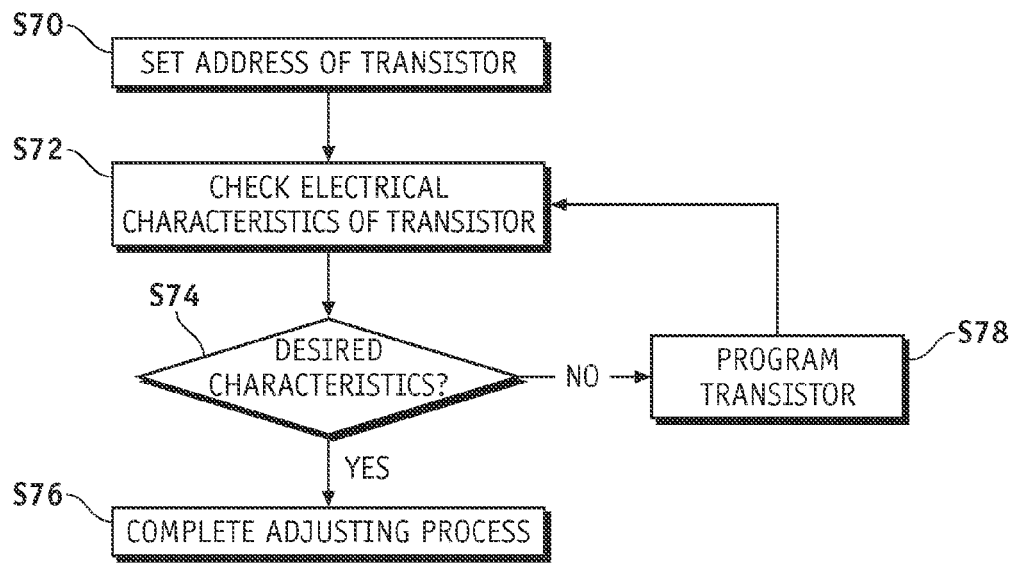
FIG. 18 is a flowchart of an adjusting process in accordance with the second embodiment of the present invention.
Figure 19:
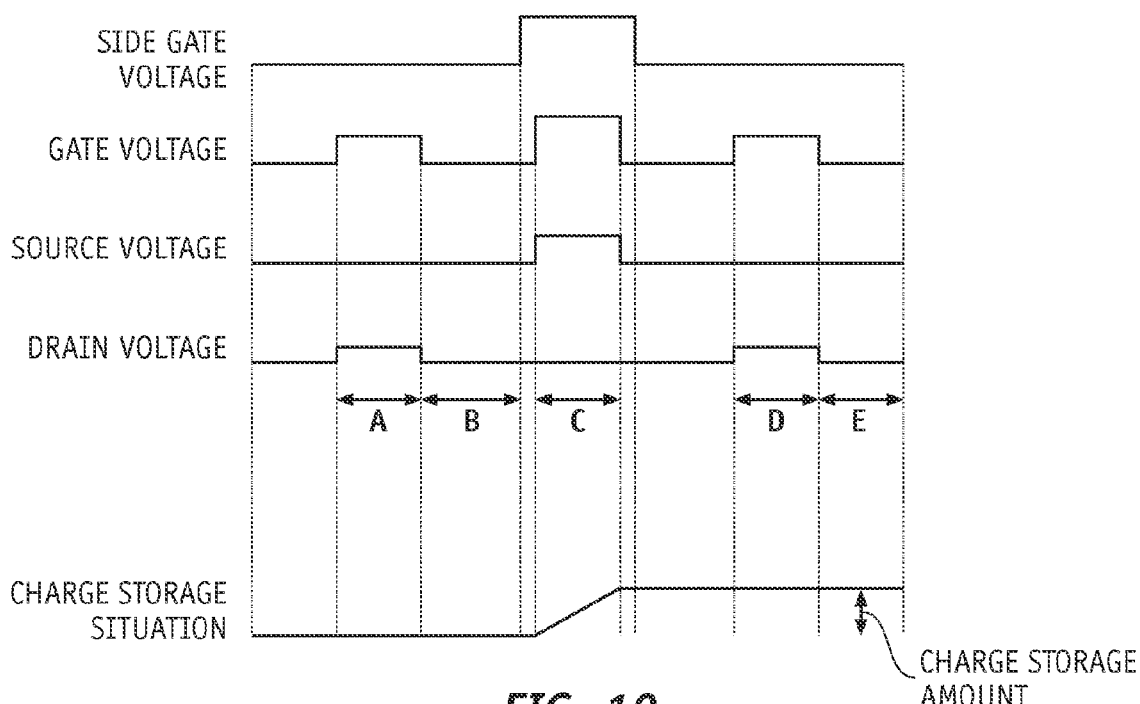
FIG. 19 is a timing diagram of the adjusting process in accordance with the second embodiment of the present invention.

A description will be given of a process for changing and adjusting (an adjusting process) the electrical characteristic of the given transistor included in the analog circuit portion 50 to a desired value in an electrical and non-volatile fashion, with an example of a case where the drain current is programmed. FIG. 18 is a flowchart showing the adjusting process. And FIG. 19 shows a timing diagram of voltages of respective terminals in the given transistor during the adjusting process.

First, in step S70 in FIG. 18, an address of the given transistor is set. Specifically, the address of the transistor is supplied to the row decoder 52 and the column decoder 54 from the address register 56 to specify the transistor with the row decoder 52 and the column decoder 54. At this time, all the voltages are set to OFF in FIG. 19.

Next, in step S72 in FIG. 18, the electrical characteristic of the transistor is checked (measured). The gate voltage and the drain voltage are applied to the respective terminals of the transistor as shown in a region A in FIG. 19. The sense amplifier 58 reads out the electrical characteristic of the transistor and outputs such information to the externally connected circuit 66 from the I/O portion 60.

Then, in step S74 in FIG. 18, it is determined whether the electrical characteristic of the transistor is a desired one. The differential amplifier 62 outputs a difference between a reference voltage Vreff and the voltage of the I/O portion 60 to the side gate voltage applying/controlling portion 64, to judge whether the addressed transistor has the desired characteristic. All the terminals of the transistor are set to OFF as shown in a region B in FIG. 19.

If the electrical characteristic of the transistor is the desired one, processing proceeds to step S76 and the adjusting process is completed. If not, processing proceeds to step S78. At step S78, the side gate voltage applying/controlling portion 64 applies the voltage to the given transistor so as to change (program) the electrical characteristic of the given transistor in an electrical and non-volatile fashion. In FIG. 19, a given side gate voltage is applied. Then, the gate voltage and the source voltage are applied in a region C. That is to say, the channel width of the transistor is electrically controlled by applying the voltage to the side gate provided in the vicinity of the channel. This programs the charge storage region in the ONO film included in the transistor. The gate voltage- and the source voltage are then set to OFF, and the side gate voltage is set to OFF. Processing then goes back to step S72.

At step S72, the gate voltage and the source voltage are applied again (in a region D in FIG. 19), and the drain current is checked. At step S74, it is determined whether the drain current is a desired value. Voltages of all the terminals are then set to OFF (in a region E in FIG. 19). If it is a desired value, processing proceeds to step S76 and the adjusting process is completed.

In this manner, it is possible to adjust the drain current of the given transistor to a desired value. In the same manner, it is also possible to change and adjust the threshold voltage of the transistor to a desired value electrically and in a non-volatile manner. In addition, step S78 may be a process for erasing the charge storage region in the ONO film included in the transistor. The adjusting process, for example, may be implemented during testing of the wafer or during a delivery inspection after packaging. In this case, the externally connected circuit 66 shown in FIG. 17 may be testing with a test device such as an LSI tester. This enables an immediate adjusting process.

In accordance with the second embodiment, after the transistor is formed on the semiconductor substrate, a process is provided for changing and adjusting the electrical characteristic (an adjusting process) in a non-volatile fashion. Therefore, the circuit characteristic can be adjusted to the desired one by changing a characteristic such as the threshold voltage or the drain current of the transistor in a non-volatile fashion, even in the case where the circuit characteristic of the circuit having the transistor fabricated on the substrate does not have the desired characteristic. This enables the circuit characteristics on the respective semiconductor devices to have the desired characteristics, even if conditions fluctuate in the gate length or the ion implantation, for example. In addition, this eliminates the necessity of repeated design and repeated trial production during the development of an analog circuit IC until the desired circuit characteristics are obtained, making it possible to develop a new analog circuit in a short time.

Although a few preferred embodiments of the present invention have been shown and described, it is appreciated by those skilled in the art that changes may be made in these embodiments without departing from the principles and spirit of the invention, the scope of which is defined in the claims hereinbelow and their equivalents. For example, the above-mentioned embodiments have exemplified an analog circuit, yet the present invention is equally applicable to a digital circuit.

What is claimed is:

1. A semiconductor device comprising: an ONO film formed on a semiconductor substrate; a first gate, the first gate formed on the ONO film; a source provided in the semiconductor substrate at a first side of the first gate; a drain provided in the semiconductor substrate at a second side of the first gate opposite the first side, wherein the source and the drain face each other across the first gate to form a channel in the semiconductor substrate below the first gate; and a second gate, the second gate being a side gate provided at a third side of the first gate, wherein the third side is distinct from the first side where the source is provided and the second side where the drain is provided and is located above the semiconductor substrate and alongside the channel formed by the source and the drain in the semiconductor substrate.

2. The semiconductor device as claimed in claim 1, further comprising an insulation film between the second gate and the channel.

3. The semiconductor device as claimed in claim 1, wherein a transistor including the ONO film, the first gate, the source and the drain has an electrical characteristic changed in a non-volatile fashion in response to a voltage applied to the side second gate in a non-volatile fashion.

4. The semiconductor device as claimed in claim 3, wherein a non-volatile change of the electrical characteristic of the transistor depends on a charge storage region formed in the ONO film.

5. The semiconductor device as claimed in claim 3, wherein the electrical characteristic of the transistor includes at least one of a threshold voltage of the transistor and a drain current thereof.

6. The semiconductor device as claimed in claim 1, wherein a charge is stored in a charge storage region formed in the ONO film.

7. A method of for fabricating a semiconductor device comprising: forming a transistor having a first gate and a second gate on a semiconductor substrate, the first gate formed over a channel in the semiconductor substrate between a source on a first side of the first gate and a drain on a second side of the first gate, wherein the second gate is formed between the source and the drain alongside the channel on a third side of the first gate, wherein the third side is different from the first and second sides of the first gate; and electrically changing and adjusting an electrical characteristic of the transistor in a non\- volatile fashion.

8. The method as claimed in claim 7, wherein electrically adjusting the electrical characteristic of the transistor comprises:
checking the electrical characteristic of the transistor;
determining whether the electrical characteristic of the transistor is a desired characteristic; and
changing the electrical characteristic of the transistor in the non-volatile fashion if the electrical characteristic thereof is not the desired characteristic.

9. The method as claimed in claim 7, wherein electrically adjusting the electrical characteristic comprises forming a charge storage region in an ONO film included in of the transistor.

10. The method as claimed in claim 7, wherein the electrical characteristic of the transistor includes at least one of a threshold voltage of the transistor and a drain current thereof.

11. The method as claimed in claim 7, wherein electrically changing and adjusting the electrical characteristic of the transistor comprises: electrically controlling a width of the channel of the transistor formed between the source and the drain; and programming or erasing a charge storage region in an ONO film included in the transistor.

12. The method as claimed in claim 11, wherein electrically controlling the width of the channel comprises applying a voltage to the second gate.

13. A method of for controlling a semiconductor device comprising: checking an electrical characteristic of a transistor, the transistor having a first gate and a second gate, the first gate located over a channel formed between a source on a first side of the first gate and a drain on a second side of the first gate and the second gate is located alongside the channel between the source and the drain on a third side of the first gate different from the first and second sides thereof; and electrically changing adjusting the electrical characteristic of the transistor in a non-volatile fashion if the electrical characteristic of the transistor is not a desired characteristic.

14. The method as claimed in claim 13, wherein electrically adjusting the electrical characteristic comprises forming a charge storage region in an ONO film included in the transistor.

15. The method as claimed in claim 13, wherein the electrical characteristic of the transistor includes at least one of a threshold voltage of the transistor and a drain current thereof.

16. The method as claimed in claim 13, wherein electrically adjusting the electrical characteristic of the transistor comprises: electrically controlling a width of the channel of the transistor; and programming or erasing a charge storage region in an ONO film included in the transistor.

17. The method as claimed in claim 16, wherein electrically controlling the width of the channel of the transistor comprises applying a voltage to the second gate.

* * * * *